United States Patent
Hanaoka

(10) Patent No.: US 6,958,527 B2
(45) Date of Patent: Oct. 25, 2005

(54) WIRING BOARD HAVING INTERCONNECT PATTERN WITH LAND, AND SEMICONDUCTOR DEVICE, CIRCUIT BOARD, AND ELECTRONIC EQUIPMENT INCORPORATING THE SAME

(75) Inventor: Terunao Hanaoka, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/654,424

(22) Filed: Sep. 4, 2003

(65) Prior Publication Data
US 2004/0075177 A1  Apr. 22, 2004

(30) Foreign Application Priority Data
Oct. 11, 2002 (JP) .............................. 2002-298324

(51) Int. Cl.[7] .......................... H01L 23/12; H01L 21/60
(52) U.S. Cl. ................. 257/668; 257/780; 257/696; 257/698; 257/690; 257/691; 257/774; 257/680; 257/773; 257/788; 361/774; 361/736; 361/746; 361/760; 361/807; 361/809; 174/255; 174/356; 174/259; 174/260
(58) Field of Search ............................. 257/780, 668, 257/696, 690, 691, 698, 700, 701, 774, 773, 257/680, 738, 734, 737, 782, 788; 361/774, 361/736, 746, 760, 807, 809; 174/255, 356, 174/259, 260

(56) References Cited

U.S. PATENT DOCUMENTS

| | | | | |
|---|---|---|---|---|
| 5,973,931 A * | 10/1999 | Fukasawa | ................... | 361/774 |
| 6,448,504 B1 * | 9/2002 | Taguchi | ..................... | 174/255 |
| 6,483,191 B2 * | 11/2002 | Umezaki | .................... | 257/738 |
| 6,492,714 B1 * | 12/2002 | Kasatani | .................... | 257/678 |
| 6,734,557 B2 * | 5/2004 | Taniguchi et al. | .......... | 257/738 |
| 2002/0064901 A1 * | 5/2002 | Miyazaki et al. | .......... | 438/106 |
| 2002/0084107 A1 * | 7/2002 | Chang et al. | ............... | 174/262 |
| 2003/0047801 A1 * | 3/2003 | Azuma | ....................... | 257/700 |

FOREIGN PATENT DOCUMENTS

JP    A 11-297873    10/1999

OTHER PUBLICATIONS

U.S. Appl. No. 09/700,464, filed Nov. 15, 2000, Hanaoka et al.
U.S. Appl. No. 10/678,215, filed Oct. 6, 2003, Hanaoka.

* cited by examiner

Primary Examiner—Alexander Oscar Williams
(74) Attorney, Agent, or Firm—Oliff & Berridge, PLC

(57) ABSTRACT

A wiring board includes a substrate, and an interconnect pattern which is formed on the substrate and includes a land. A penetration hole, which exposes the substrate, is formed in the land. The penetration hole is formed in a region along a periphery of the land.

17 Claims, 4 Drawing Sheets

WIRING BOARD HAVING INTERCONNECT PATTERN WITH LAND, AND SEMICONDUCTOR DEVICE, CIRCUIT BOARD, AND ELECTRONIC EQUIPMENT INCORPORATING THE SAME

Japanese Patent Application No. 2002-298324 filed on Oct. 11, 2002, is hereby incorporated by reference in its entirety.

BACKGROUND OF THE INVENTION

The present invention relates to a wiring board, a method of manufacturing the same, a semiconductor device, a circuit board, and electronic equipment.

In the case of mounting a semiconductor device on a substrate, it is important to reduce stress applied to an electrical connection section between the semiconductor device and the substrate. The stress occurs due to the difference in coefficient of thermal expansion between a semiconductor chip and the substrate. If the stress cannot be sufficiently reduced, breakage of an external terminal (solder ball) of the semiconductor device or breakage of an interconnect may occur.

BRIEF SUMMARY OF THE INVENTION

A wiring board according to one aspect of the present invention comprises:

a substrate; and an interconnect pattern which is formed on the substrate and includes a land, wherein a penetration hole which exposes the substrate is formed in the land, and wherein the penetration hole is formed in a region along a periphery of the land.

A semiconductor device according to another aspect of the present invention comprises:

the above wiring board, and a semiconductor chip which is electrically connected with the interconnect pattern.

A circuit board according to a further aspect of the present invention has the above semiconductor device mounted thereon.

Electronic equipment according to a still further aspect of the present invention comprises the above semiconductor device.

A method of manufacturing a wiring board according to a yet further aspect of the present invention comprises:

forming an interconnect pattern including a land on a substrate, wherein a penetration hole which exposes the substrate is formed in a region along a periphery of the land.

DETAILED DESCRIPTION OF THE EMBODIMENT

Figure 1:
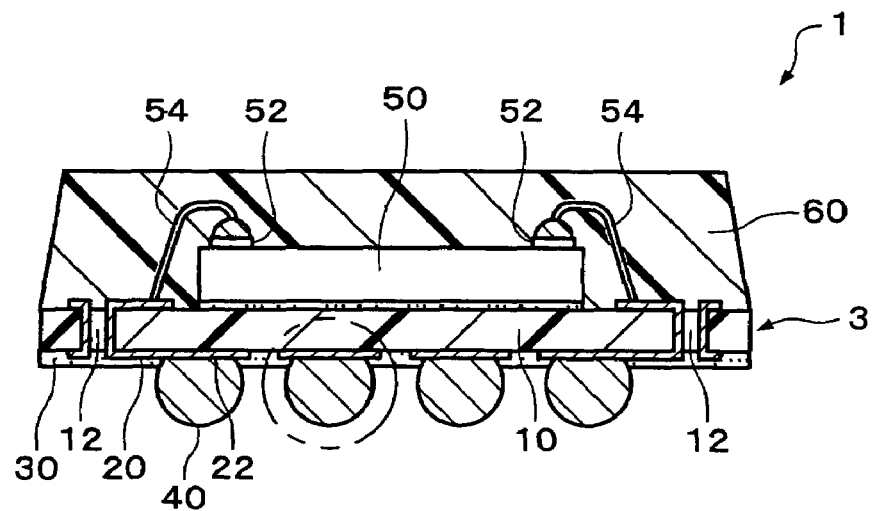
FIG. 1 shows a semiconductor device according to an embodiment of the present invention.

Embodiments of the present invention may improve reliability of a wiring board by reducing stress.

(1) A wiring board according to one embodiment of the present invention comprises:

a substrate; and an interconnect pattern which is formed on the substrate and includes a land, wherein a penetration hole which exposes the substrate is formed in the land, and wherein the penetration hole is formed in a region along a periphery of the land.

According to this wiring board, the penetration hole which exposes the substrate is formed in the land. The penetration hole is formed along the periphery of the land. This enables the center portion of the land to be easily deformed, whereby stress applied to the wiring board can be reduced. Therefore, breakage of the interconnect pattern can be prevented, whereby reliability of the wiring board can be improved.

(2) In this wiring board, a planar shape of the land may be approximately circular.

(3) In this wiring board, the penetration hole may be an elongated hole.

(4) In this wiring board, the penetration hole may be the elongated hole which is longer in a direction along the periphery of the land than in a direction intersecting the periphery of the land at right angles.

This enables the penetration hole to be formed avoiding the center portion of the land.

(5) In this wiring board, a plurality of the penetration holes may be formed in the land.

This enables the land to be deformed more easily.

(6) In this wiring board, the plurality of penetration holes may be arranged in a region along the periphery of the land.

This enables the center portion of the land to be easily deformed when stress is applied to the land, whereby stress can be effectively reduced.

(7) In this wiring board, the plurality of penetration holes may be disposed so that distance between the adjacent penetration holes is approximately the same.

This enables the land to be easily deformed when stress is applied to the land in every direction.

(8) This wiring board may further comprise a resist layer which is formed on a surface of the substrate on which the interconnect pattern is formed and includes an opening which exposes at least a part of the land.

(9) In this wiring board, a planar shape of the opening of the resist layer may be approximately circular.

(10) In this wiring board, the resist layer may cover at least a part of the penetration hole.

(11) In this wiring board, the resist layer may cover the penetration hole, and part of an edge of the penetration hole may be in contact with an edge of the opening of the resist layer.

(12) This wiring board may be formed as an interposer.

(13) This wiring board may be formed as a motherboard.

(14) A semiconductor device according to another embodiment of the present invention comprises:

the above wiring board, and a semiconductor chip which is electrically connected with the interconnect pattern.

According to this semiconductor device, stress applied to the semiconductor device can be reduced.

(15) This semiconductor device may further comprise an external terminal formed on the land.

This enables stress applied to the semiconductor device to be reduced, whereby breakage of the external terminal can be prevented.

(16) A circuit board according to a further embodiment of the present invention has the above semiconductor device mounted thereon.

(17) Electronic equipment according to a still further embodiment of the present invention comprises the above semiconductor device.

(18) A method of manufacturing a wiring board according to a yet further embodiment of the present invention comprises:

forming an interconnect pattern including a land on a substrate, wherein a penetration hole which exposes the substrate is formed in a region along a periphery of the land.

According to this method of manufacturing a wiring board, the penetration hole which exposes the substrate is formed in a region along the periphery of the land. This enables the center portion of the land to be easily deformed, whereby stress applied to the wiring board can be reduced. Therefore, breakage of the interconnect pattern can be prevented, whereby reliability of the wiring board can be improved.

(19) In this method of manufacturing a wiring board, the penetration hole may be formed at the same time as the interconnect pattern.

This enables the wiring board to be manufactured by a reduced number of steps.

(20) In this method of manufacturing a wiring board, a plurality of the penetration holes may be formed in the land.

This enables the land to be deformed more easily.

(21) This method of manufacturing a wiring board may further comprise:

forming a resist layer on a surface of the substrate, on which the interconnect pattern is formed, in a manner that the resist layer includes an opening which exposes at least a part of the land.

The embodiments of the present invention are described below with reference to the drawings. However, the present invention is not limited to the following embodiments.

Figure 2:
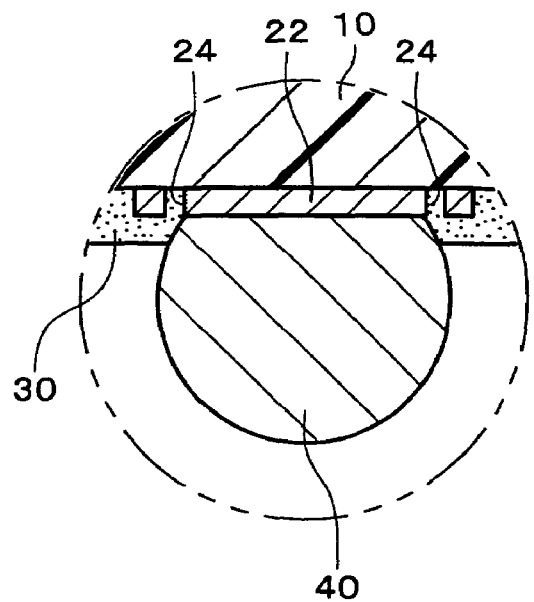
FIG. 2 is a partially enlarged view of FIG. 1.
Figure 3:
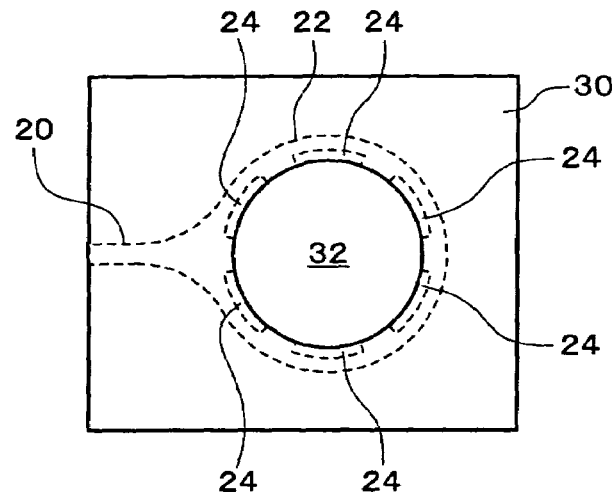
FIG. 3 shows a semiconductor device according to an embodiment of the present invention.

FIG. 1 shows a semiconductor device according to an embodiment of the present invention. FIG. 2 is a partial enlarged view of FIG. 1. FIG. 3 is a plan view of FIG. 2. In FIG. 3, a part of the semiconductor device (interconnect layer, external terminal, etc.) is omitted. FIGS. 4 to 7 show a modification of the present embodiment.

A semiconductor device 1 includes a wiring board 3. As shown in FIG. 1, the wiring board 3 may be an interposer for a semiconductor package. In more detail, the wiring board 3 may be used to place and route between the semiconductor chip 50 and the circuit board (motherboard) 70 (see FIG. 8). The wiring board 3 includes a substrate 10 and an interconnect pattern 20.

The substrate 10 is formed of an insulating material at least in the area in which a land 22 described later is formed. The entire substrate 10 may be formed of an insulating material, or only the surface of the substrate 10 on which the land 22 is formed may be formed of an insulating material. The surface of the substrate 10 may be formed of an insulating material only in the area in which the land 22 is formed. The substrate 10 may be formed of either an organic material (polyimide substrate, for example) or an inorganic material (ceramic substrate or glass substrate, for example), or a composite structure of these materials (glass epoxy substrate, for example). The planar shape of the substrate 10 is not limited but generally has a rectangular shape. The substrate 10 may be a single layer substrate, or may be a substrate having a multilayer built-up structure formed by stacking an insulating resin and an interconnect pattern, or a multilayer substrate in which a plurality of substrates are stacked.

The interconnect pattern 20 is made up of a plurality of interconnects. As shown in FIG. 1, the interconnect pattern 20 may be formed on both surfaces of the substrate 10. In this case, through holes 12 for electrically connecting one surface of the substrate 10 with the other surface are formed in the substrate 10. A conductive layer (plating layer in many cases) may be formed on the inner surface of the through hole 12, or the through hole 12 may be filled with a conductive material. The interconnect pattern 20 may be formed by stacking at least one of copper (Cu), chromium (Cr), titanium (Ti), nickel (Ni), titanium tungsten (TiW), gold (Au), aluminum (Al), nickel vanadium (NiV), and tungsten (W). The interconnect pattern 20 may be bonded to the substrate 10 through an adhesive (not shown) to make up a three-layer substrate. In this case, the interconnect pattern 20 is formed by etching the material layer after applying photolithography. The interconnect pattern 20 may be formed on the substrate 10 without using an adhesive to make up a two-layer substrate. For example, the interconnect pattern 20 may be formed by sputtering or the like, or an additive method in which the interconnect pattern 20 is formed by electroless plating may be applied.

The interconnect pattern 20 includes a plurality of lands 22. Each of the lands 22 is wider than the line of the interconnect pattern 20. The planar shape of the land 22 may be circular, oval or rectangular. In the example shown in FIG. 1, the land 22 is formed on a surface of the substrate 10 opposite to the surface on which the semiconductor chip 50 is mounted. Specifically, the land 22 may be an electrical connection section with a circuit board (motherboard). As a modification, the land may be formed on the surface of the substrate 10 on which the semiconductor chip 50 is mounted, and may be an electrical connection section with the semiconductor chip 50.

In the example shown in FIG. 1, the land 22 is formed not to overlap with the through hole 12. In this case, the through hole 12 is electrically connected with the land 22 through the line of the interconnect pattern 20. As a modification, the land 22 may be formed to overlap with the through hole 12.

As shown in FIG. 2, a penetration hole 24 which exposes the substrate 10 is formed in the land 22. The penetration hole 24 is formed in a region along the periphery of the land 22. This enables the land 22 to be easily deformed when stress is applied to the land 22 in comparison with the case where the penetration hole 24 is not formed in the land 22. In more detail, the center portion (area surrounded by the penetration holes, for example) of the land 22 is easily deformed. Since stress is reduced by allowing the land 22 to be deformed, breakage of the interconnect pattern 20 can be prevented. The entire back surface (surface on the side of the substrate) of the land 22 is in contact with the substrate 10.

In the case where the interconnect pattern 20 (land 22 in more detail) formed of a plurality of layers, the penetration hole 24 is formed through all the layers. As shown in FIG. 3, a plurality of the penetration holes 24 may be formed in one land 22. This enables the land 22 to be deformed more easily.

As shown in FIG. 3, the penetration holes 24 are arranged in a region along the periphery of the land 22. In the case where the land 22 is circular, the penetration holes 24 may be arranged on a circumference of a virtual circle (not shown) which is a little smaller than the land 22. Since the center portion of the land 22 is easily deformed when stress is applied to the land 22 by allowing the center portion of the land 22 to be surrounded by the penetration holes 24, stress can be effectively reduced.

As shown in FIG. 3, the penetration hole 24 may be an elongated hole. In this case, the penetration hole 24 may be an elongated hole which is longer in the direction along the periphery of the land 22. This enables the penetration hole 24 to be formed avoiding the center portion of the land 22 even in the case of forming an elongated hole, whereby a region in which the external terminal 40 is formed can be secured sufficiently. The inner edge of the elongated hole may be angled.

The penetration holes 24 may be disposed so that the distance between the adjacent penetration holes 24 along the periphery of the land 22 is approximately the same. This enables the land 22 to be easily deformed when stress is applied to the land 22 in every direction. The penetration holes 24 may be disposed at symmetrical positions in the land 22. In more detail, the penetration holes 24 may be disposed at positions point-symmetrical to the center point (not shown) of the land 22, or disposed at positions line-symmetrical to the center line (not shown) of the land 22.

Figure 6:
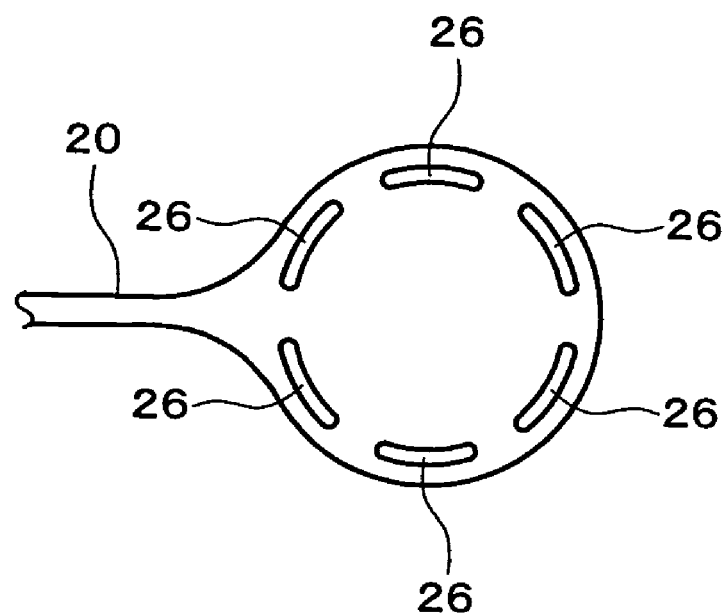
FIG. 6 shows a semiconductor device according to another modification of an embodiment of the present invention.

As shown in a modification of FIG. 6, the inner edge of the long penetration hole 26 may be rounded. Concentration of stress applied to the land 22 can be prevented by eliminating the angled section from the land 22.

Figure 7:
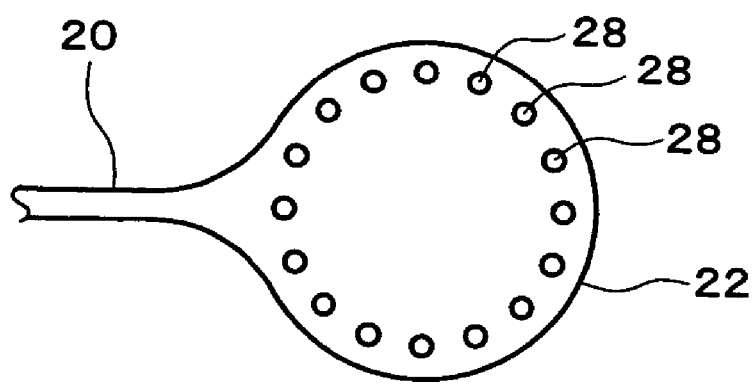
FIG. 7 shows a semiconductor device according to still another modification of an embodiment of the present invention.

As shown in a modification of FIG. 7, a penetration hole 28 may be a round hole. A plurality of round holes may be arranged along the periphery of the land 22. If the distance between the adjacent round holes is approximately the same, the land 22 is easily deformed when stress is applied to the land 22 in every direction. The penetration holes (round holes) 28 may be formed over the entire surface of the land 22 differing from the example shown in FIG. 7. This also enables the land 22 to be easily deformed when stress is applied.

As shown in FIG. 1, the wiring board 3 further includes a resist layer (solder resist, for example) 30. The resist layer 30 is formed on the surface of the substrate 10 on which the interconnect pattern 20 is formed, and covers a part of the interconnect pattern 20. The resist layer 30 includes an opening 32 which exposes at least a part of the land 22. As shown in FIGS. 2 and 3, the resist layer 30 may cover the periphery of the land 22. The resist layer 30 may cover only the line of the interconnect pattern 20 without covering the land 22.

The planar shape of the opening 32 of the resist layer 30 may be circular, oval, or rectangular. The planar shape of the opening 32 may be similar to, but smaller than that of the land 22. In the case where the resist layer 30 covers a part of the land 22, the resist layer 30 may cover at least a part of the penetration holes 24.

As shown in FIG. 3, the resist layer 30 may cover the penetration holes 24. This allows the resist layer 30 to come in contact with the substrate 20 in the penetration holes 24, whereby adhesion between the resist layer 30 and the substrate 20 is increased. Since the contact surface between the land 22 and the external terminal 40 can be made circular due to the circular shape of the opening 32, concentration of stress applied to the external terminal 40 can be prevented. The penetration holes 24 are located outside the opening 32 of the resist layer 30 and part of an edge of the each penetration hole 24 is in contact with the edge of the opening 32. This allows part of the edge of the each penetration hole 24 to be merely in contact with the edge of the opening 32 and not to be entirely covered with the resist layer 30, whereby the resist layer 30 does not hinder deformation of the land 22.

As shown in FIG. 3, the center portion (region surrounded by the penetration holes in FIG. 3) of the land 22 is connected with the edge of the land 22 at a plurality of portions. Therefore, even if stress concentrates at the connection portions between the center portion and the edge of the land 22 and breakage occurs in any connection portion, connection between the center portion and the edge of the land 22 can be maintained in the other connection portions.

Figure 4:
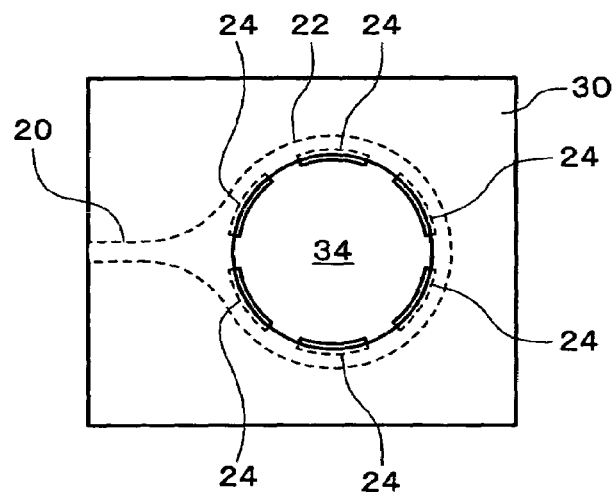
FIG. 4 shows a semiconductor device according to a modification of an embodiment of the present invention.

As shown in a modification of FIG. 4, the resist layer 30 may cover a part of the penetration holes 24. In the example shown in FIG. 4, the resist layer 30 covers a part of each of the penetration holes 24. For example, half of each of the penetration holes 24 may be covered with the resist layer 30, and the remaining half may be exposed in an opening 34. The resist layer 30 may cover at least one of the penetration holes 24 (excluding the case of covering all the penetration holes 24) differing from the example shown in FIG. 4.

Figure 5:
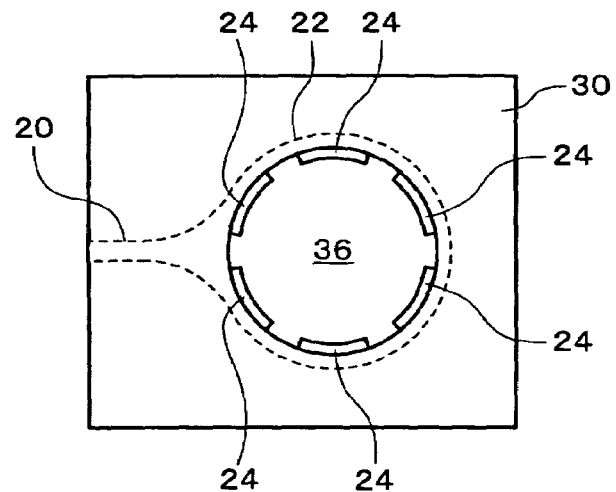
FIG. 5 shows a semiconductor device according to another modification of an embodiment of the present invention.

As shown in a modification of FIG. 5, the resist layer 30 may not cover the penetration holes 24. Specifically, the penetration holes 24 may be exposed in an opening 36 of the resist layer 30. In this case, the penetration holes 24 may be located in a region inside the edge of the opening 36 of the resist layer 30 and part of an edge of the each penetration hole 24 is in contact with the of the opening 36.

In the present embodiment, the land 22 is formed in a flat region of the substrate 10. However, the present invention is not limited thereto. For example, a part of the substrate 10 may be formed in the shape of a projection, and the land 22 may be integrally formed on the upper surface and the side surface of the projection. In this case, the substrate 10 includes a plurality of projections (projections in the shape of a conical trapezoid, for example) corresponding to positions at which the external terminals 40 are formed (matrix arrangement, for example). The projection may be formed of a resin or a metal such as copper. The penetration hole 24 may be formed in the side surface of the projected portion of the land 22. Stress can be further reduced by forming the projection.

As a modification, the wiring board 3 may be a circuit board (motherboard). A plurality of electronic components (optical devices, resistors, capacitors, coils, oscillators, filters, thermosensors, thermistors, varistors, variable resistors, fuses, and the like) are mounted on the circuit board in addition to the semiconductor device.

In the wiring board according to the present embodiment, the penetration hole 24 which exposes the substrate 10 is formed in the land 22. The penetration hole 24 is formed in the region along the periphery of the land 22. This enables the center portion of the land 22 to be easily deformed, whereby stress applied to the wiring board can be relieved. Therefore, breakage of the interconnect pattern 20 can be prevented, whereby reliability of the wiring board can be improved.

The semiconductor device according to the present embodiment is described below. As shown in FIG. 1, the semiconductor device 1 includes the wiring board 3 as an interposer and the semiconductor chip 50. The semiconductor chip 50 is electrically connected with the interconnect pattern 20.

The semiconductor chip 50 is generally a silicon chip. However, the material for the semiconductor chip 50 is not limited. The semiconductor chip 50 is generally in the shape of a rectangular parallelepiped, however, may be in the shape of a cube or a sphere. An integrated circuit (not shown) is formed on the semiconductor chip 50. The semiconductor chip 50 includes a plurality of electrodes 52. The electrodes 52 are electrically connected with the integrated circuit. The electrodes 52 may be arranged along two parallel sides of the semiconductor chip, along four sides of the semiconductor chip, or in the center portion of the semiconductor chip. A protective film (passivation film, for example) is formed on the surface (surface on which the electrodes 52 are formed) of the semiconductor chip 50 so as to avoid the electrodes 52.

The semiconductor chip 50 is mounted on the wiring board 3. In the example shown in FIG. 1, the semiconductor chip 50 is mounted so that the surface of the semiconductor chip 50 on which the electrodes 52 are formed is opposite to the wiring board 3 (i.e. formed facing upward). In other words, the semiconductor chip 50 is mounted facing up on the wiring board 3. The semiconductor chip 50 may be bonded to the wiring board 3 through an adhesive.

As shown in FIG. 1, the semiconductor chip 50 may be electrically connected with the interconnect pattern 20 through wires 54. In this case, a ball bonding method may be applied. In more detail, the tip of the wire 54 pulled out from a tool (capillary, for example) (not shown) is caused to melt in the shape of a ball, and is thermally bonded (ultrasonic vibration is preferably used in combination) to the electrode 52. The wire 54 is pulled out in the direction of the wiring board 3, and a part of the wire 54 is bonded to a part of the interconnect pattern 20.

As a modification, the semiconductor chip 50 may be bonded face down to the wiring board 3. In this case, the interconnect pattern 20 is electrically connected with bumps formed on the electrodes 52. This electrical connection can be performed by using an anisotropic conductive material, metal junction (Au—Au, Au—Sn, solder, etc.), or shrinkage force of an insulating resin.

As shown in FIG. 1, the semiconductor chip 50 on the wiring board 3 is sealed with a sealing section 60. A material for the sealing section 60 may be a resin (epoxy resin, for example). The sealing method is not limited. For example, the semiconductor chip 50 may be sealed by filling a recess of a mold with the sealing material, or by applying a potting method.

The semiconductor device 1 further includes the external terminals 40. The external terminals 40 are electrically connected with the interconnection pattern 20. The external terminals 40 may be formed on the lands 22. The external terminals 40 are formed of a conductive metal (alloy, for example) and enables electrical connection upon melting (solder, for example). The external terminals 40 may be formed of soft solder or hard solder. The external terminals 40 may be in the shape of a sphere (solder ball, for example).

The semiconductor device according to the present embodiment has the above-described effects. Specifically, since the center portion of the land 22 is easily deformed, stress applied to the semiconductor device can be relieved. Therefore, breakage of the interconnect pattern 20 and breakage of the external terminal 40 can be prevented, whereby reliability of the semiconductor device can be improved.

A method of manufacturing the wiring board according to the present embodiment includes forming the interconnect pattern 20 including the land 22 on the substrate 10. The penetration hole 24 which exposes the substrate 10 is formed in a region along the periphery of the land 22. A plurality of the penetration holes 24 may be formed in the land 22.

The penetration hole 24 may be formed after forming the interconnect pattern 20. In this case, the penetration hole 24 may be formed by patterning a resist (not shown) as a mask by applying exposure technology or the like, and etching an area exposed from the resist. The penetration hole 24 may be formed at the same time as the interconnect pattern 20. In this case, the penetration hole 24 may be formed at the same time as patterning the interconnect pattern 20 by applying the exposure technology. A conductive material may be deposited by using a plating method. If the penetration hole 24 is formed at the same time as the interconnect pattern 20, the penetration hole 24 can be easily formed by a reduced number of steps. The penetration hole 24 may be formed by applying another conventional technology (laser beam, inkjet, printing, etc.). A resist layer (solder resist, for example) 20 is applied, and a predetermined area (area including at least part of the land) is exposed by using the exposure technology or laser beam. The details described for the wiring board are applied to the other items.

A method of manufacturing the semiconductor device according to the present embodiment includes a step of mounting the semiconductor chip 50 by using the above wiring board. The external terminal 40 may be formed by printing solder on the land 22 of the wiring board and performing a reflow step.

Figure 8:
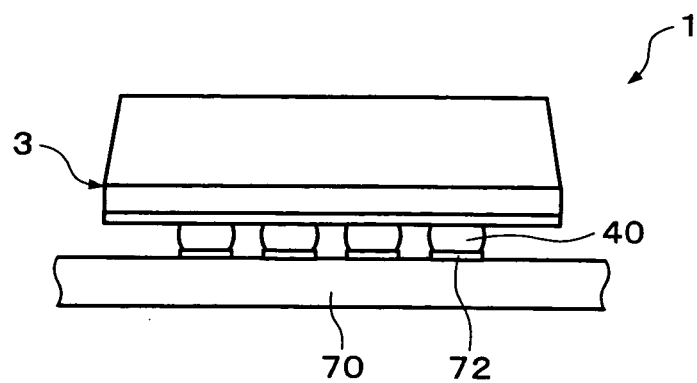
FIG. 8 shows a circuit board according to an embodiment of the present invention.

FIG. 8 shows a circuit board on which the semiconductor device is mounted. The interconnect pattern 72 is formed on the circuit board (motherboard) 70. The external terminals 40 are bonded to the interconnect pattern 72. This enables stress which occurs due to the difference in coefficient of thermal expansion between the circuit board 70 and the semiconductor device 1 to be effectively relieved.

Figure 9:
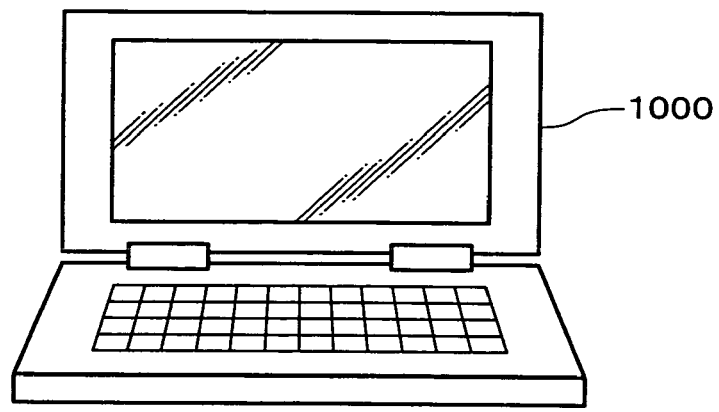
FIG. 9 shows electronic equipment according to an embodiment of the present invention.
Figure 10:
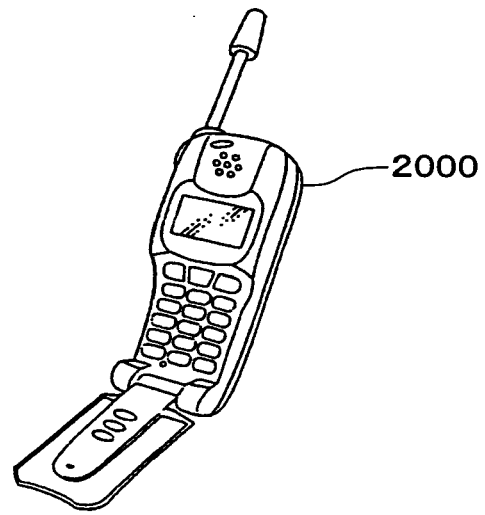
FIG. 10 shows another type of electronic equipment according to an embodiment of the present invention.

FIGS. 9 and 10 respectively show a notebook-type personal computer 1000 and a portable telephone 2000 as examples of electronic equipment including the semiconductor device according to the embodiment of the present invention.

The present invention is not limited to the above-described embodiments. Various modifications and variations are possible. For example, the present invention includes configurations substantially the same as the configurations described in the embodiments (for example, configurations having the same function, method, and results, or configurations having the same object and results). The present invention includes configurations in which any unessential part of the configuration described in the embodiments is replaced. The present invention includes configurations having the same effects or achieving the same object as the configurations described in the embodiments. The present invention includes configurations in which conventional technology is added to the configurations described in the embodiments.

What is claimed is:

1. A wiring board comprising:
   a substrate;
   an interconnect pattern which is formed on the substrate and includes a land having a penetration hole; and
   a resist layer covering at least the penetration hole, the penetration hole being formed in a region along a periphery of the land.

2. The wiring board as defined in claim 1, wherein a planar shape of the land is approximately circular.

3. The wiring board as defined in claim 1, wherein the penetration hole is an elongated hole exposing the substrate.

4. The wiring board as defined in claim 3, wherein the penetration hole is the elongated hole which is longer in a direction along the periphery of the land than in a direction intersecting the periphery of the land at right angles.

5. The wiring board as defined in claim 1, wherein a plurality of the penetration holes are formed in the land.

6. The wiring board as defined in claim 5, wherein the plurality of penetration holes are arranged in a region along the periphery of the land.

7. The wiring board as defined in claim 5, wherein the plurality of penetration holes are disposed so that distance between the adjacent penetration holes is approximately the same.

8. The wiring board as defined in claim 1, further comprising:
   the resist layer being formed on a surface of the substrate on which the interconnect pattern is formed and includes an opening which exposes at least a part of the land.

9. The wiring board as defined in claim 8, wherein a planar shape of the opening of the resist layer is approximately circular.

10. The wiring board as defined in claim 8, wherein the resist layer covers at least a part of the penetration hole.

11. The wiring board as defined in claim 8,
    wherein the resist layer covers the penetration hole, and
    wherein part of an edge of the penetration hole is in contact with an edge of the opening of the resist layer.

12. The wiring board as defined in claim 1, which is formed as an interposer.

13. The wiring board as defined in claim 1, which is formed as a motherboard.

14. A semiconductor device comprising:
    the wiring board as defined in claim 1, and
    a semiconductor chip which is electrically connected with the interconnect pattern.

15. The semiconductor device as defined in claim 14, further comprising an external terminal formed on the land.

16. A circuit board on which the semiconductor device as defined in claim 14 is mounted.

17. Electronic equipment comprising the semiconductor device as defined in claim 14.

* * * * *